United States Patent [19]

Yoshimoto et al.

[11] Patent Number: 4,968,527
[45] Date of Patent: Nov. 6, 1990

[54] METHOD FOR THE MANUFACTURE OF PYROLYTIC GRAPHITE WITH HIGH CRYSTALLINITY AND ELECTRODES WITH THE SAME FOR RECHARGEABLE BATTERIES

[75] Inventors: Yoshikazu Yoshimoto, Tenri; Tomonari Suzuki, Kashihara; Hiroshi Wada, Nara; Masaru Yoshida, Nara; Shigeo Nakajima, Nara; Yoshimitsu Tajima, Nara; Nobuhiro Yanagisawa, Nara; Motoo Mohri, Nara; Michiyo Kasahara, Kyoto; Hideaki Tanaka, Tenri, all of Japan

[73] Assignee: Sharp Kabushiki Kaisha, Osaka, Japan

[21] Appl. No.: 264,598

[22] Filed: Oct. 31, 1988

[30] Foreign Application Priority Data

Jun. 24, 1986 [JP] Japan .................................. 61-149049
Mar. 31, 1987 [JP] Japan .................................. 62-79248

[51] Int. Cl.$^5$ ............................................. C23C 16/00
[52] U.S. Cl. .................................. 427/122; 429/218; 429/233; 429/245
[58] Field of Search ................. 427/122; 429/218, 233, 429/245

[56] References Cited

U.S. PATENT DOCUMENTS

| | | | |
|---|---|---|---|
| 2,239,414 | 4/1941 | Eddison | 427/122 |
| 2,719,355 | 10/1955 | Diffenderfer | 427/122 |
| 3,130,073 | 4/1964 | Linden | 427/122 |
| 3,320,093 | 5/1967 | Harding et al. | |
| 3,340,011 | 9/1967 | Hoekstra | 423/453 |
| 3,769,084 | 10/1973 | Saito | 427/78 |
| 4,018,943 | 4/1977 | Youtsey | 427/122 |
| 4,029,844 | 6/1977 | Olcott | 427/122 |
| 4,271,242 | 6/1981 | Toyoguchi | 429/218 |
| 4,645,713 | 2/1987 | Shioya | 427/122 |
| 4,666,736 | 5/1987 | Matsumura | 427/122 |
| 4,725,422 | 2/1988 | Miyabayashi | 429/218 |
| 4,835,075 | 5/1989 | Tajima | 429/218 |

FOREIGN PATENT DOCUMENTS

| | | |
|---|---|---|
| 165589 | 12/1985 | European Pat. Off. . |
| 239410 | 9/1987 | European Pat. Off. . |
| 273562 | 7/1988 | European Pat. Off. . |
| 1548959 | 12/1968 | France . |
| 26089 | of 1967 | Japan .................................. 427/122 |
| 452864 | 12/1974 | U.S.S.R. ............................ 427/122 |
| 1068932 | 5/1967 | United Kingdom . |
| 1196630 | 7/1970 | United Kingdom . |
| 1340520 | 12/1973 | United Kingdom . |

OTHER PUBLICATIONS

Webster's Seventh New Collegiate Dictionary, G & C, Merriam Company, p. 697, 1963.
A. E. Karut et al., J Appl Phys (1966), 37:2179-81.
S. D. Robertson, Chem Abs (1969), 70:486, #102553v (Nature (1969) 221:1044–46).
L. S. Lobo et al., Int Congress Catalysis 5th (1972), 79:1125-37.
T. Koyama et al., Chem Abs (1973), 79:138, #80908w, (JP 73,39,392,9/71).
L. S. Lobo et al., J Catal (1973), 29:15-19.
Y. Nishiyama et al., J Catal (1974), 33:98-107.
S. Kawasumi et al., Chem Abs (1981), 95:115, #27188r (J Catal (1981), 68:237-41).
Search Report in EPO application corresponding to present application (EP 87-305,617).

Primary Examiner—Shrive Beck
Assistant Examiner—Vi Duong Dang
Attorney, Agent, or Firm—Irell & Manella

[57] ABSTRACT

A method for the manufacture of a pyrolytic graphite with high crystallinity comprising the deposition of graphite directly onto a crystalline catalytic substrate by thermal decomposition of a carbon-containing material at a temperature of 1000° C. or less, the pyrolytic graphite having interlayer spacing in a limited range and a c-axis orientation of carbon layers perpendicular to the surface of the substrate. An electrode with graphite as an active material and a crystalline metal electrode substrate as a current collector unified, the graphite being pyrolytic graphite that is deposited on the crystalline metal electrode substrate with catalytic properties so as to cover the crystalline metal electrode substrate by the above-mentioned method.

5 Claims, 3 Drawing Sheets

FIG.1
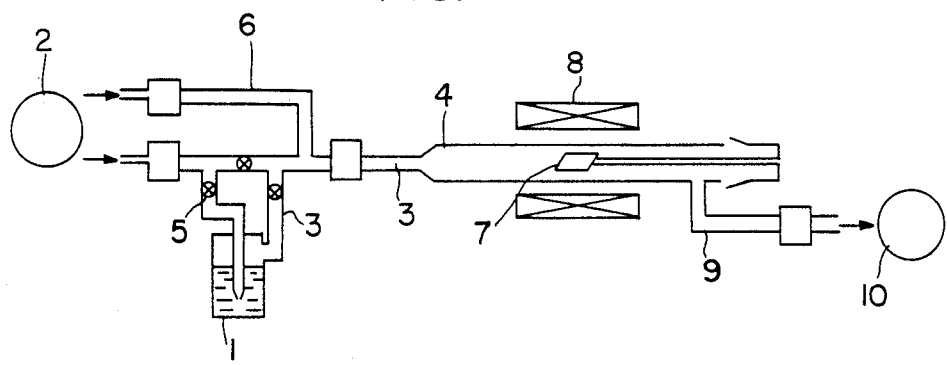
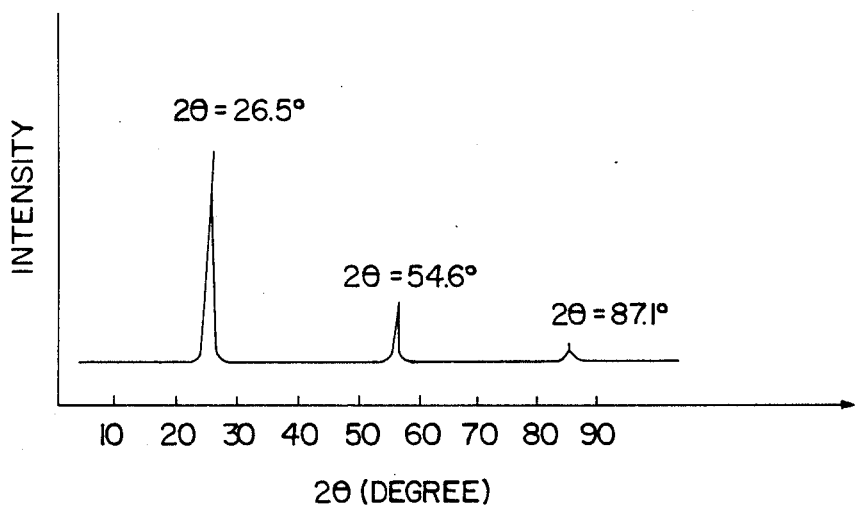
FIG.2

METHOD FOR THE MANUFACTURE OF PYROLYTIC GRAPHITE WITH HIGH CRYSTALLINITY AND ELECTRODES WITH THE SAME FOR RECHARGEABLE BATTERIES

Related Applications

This application is a continuation-in-part of copending U.S. patent application Ser. No. 65,508, filed June 23, 1987 now U.S. Pat. No. 4,863,818.

BACKGROUND OF THE INVENTION

1. Field of the invention

This invention relates to a method for the manufacture of pyrolytic graphite with high crystallinity.

It also relates to electrodes of a rechargeable battery, wherein an active material for the electrode is pyrolytic graphite with high crystallinity mentioned above, into which alkali metals, alkaline earth metals, rare earth metals, or transition metals are intercalated as an electron-donor type dopant, or halogens, halogen compounds, or oxygen acids are as an electron-acceptor type dopant.

2. Description of the prior art

In recent years, attention has been paid to secondary batteries that use an alkali metal such as lithium as an anode, with the advance of microtechnology and request for power economization in electric appliances. However, the practical application of a simple metal to secondary batteries is very difficult. A simple metal used for the electrodes, after only a couple of cycles of electrical charge-discharge, grows dendrite which causes internal shortcircuits. On the other hand, materials such as alloys with low melting points, and organic materials have been found to be able to be doped or undoped more efficiently with metal atoms such as lithium. Especially, the development of secondary batteries that make use of the electrochemical introduction of dopant between the layers of compounds with a layered structure such as graphite is progressing with special vigor.

In particular, since graphite can be introduced with both electron-donating substances and electron-accepting substances. Graphite is expected as an excellent material for use as the electrode material of secondary batteries. However, graphite is ordinarily in the form of a powder, film, foil, fiber, etc., it is difficult to form the desired shape of electrode, and also, a complicated procedure is needed to fix these kinds of materials on the substrate of the electrode, which will act as the current-collector. In these cases, a binding agent, an electric conductive material, etc., are needed as supplementary materials to form an electrode and so there are the disadvantages that the capacity per unit weight or unit volume will decrease.

It may be possible to deposit pyrolytic carbon on a conductive substrate of aluminium, copper, etc., by the chemical vapor-deposition (CVD) method, etc., so as to form an electrode. However, such carbon deposits are only slightly graphitized, so it is not possible to solve the problems that are described above. Because, for the synthesis of graphite, in general, a long period of treatment in a manufacturing step at high temperature and high pressure is needed. For example, when methane is the starting material, it is decomposed at about 2000° C. or more, and in addition, heat treatment at a high temperature of near 3500° C. and high pressure is used for the purpose of achieving graphitization. However, no conductive electrode substrates for batteries exist that can withstand such high temperatures.

As a method for producing a pyrolytic carbon at low temperatures, U.S. Pat. No. 3,769,084 to T. Saito and T. Gejyo discloses a method for forming a carbon coating on a metal substrate by thermally decomposing a hydrocarbon at a temperature lower than 800° C. In this method, the metal substrate has an amorphous nickel layer plated thereon. The nickel layer acts as a catalyst for thermal decomposition of hydrocarbons, and the thermal decomposition reaction proceeds at low temperatures.

However, the density of the carbon coating obtained by the method mentioned above is at most 1.9 g/cm$^3$. It is well known in the art that crystalline graphites have a density of 2.25 g/cm$^3$. Therefore, the carbon coating is not composed of a pyrolytic graphite with high crystallinity, which indicates that the amorphous nickel layer cannot promote graphitization of the carbon coating formed thereon.

On the other hand, there has been another method to prepare pyrolytic carbon at relatively low temperatures, utilizing dehydrogenation reactions, dehydrohalogenation reactions, decarboxylation reactions, dehydration reactions of selected organic compounds as the starting materials. However, there are no examples of carbon deposit with high crystallinity having been achieved. To make use of the structural anisotropy of graphite for the host layered material to be intercalated with lithium atoms, it is necessary to establish crystalline graphite at low temperatures.

SUMMARY OF THE INVENTION

The method for the manufacture of pyrolytic graphite with high crystallinity of this invention, which overcomes the above-discussed and numerous other disadvantages and deficiencies of the prior art, comprises the deposition of graphite directly onto a crystalline catalytic substrate by thermal decomposition of a carbon-containing material at a temperature of 1000° C. or less, the said pyrolytic graphite having interlayer spacing in a limited range and a c-axis orientation of carbon layers perpendicular to the surface of the substrate.

In a preferred embodiment, the carbon-containing material mentioned above is at least one compound selected from the group consisting of acetylene, diphenylacetylene, acrylonitrile, 1,2-di-bromo-ethylene, 2-butyne, benzene, toluene, pyridine, aniline, phenol, diplenyl, anthracene, pyrene, hexamethylbenzene, styrene, allylbenzene, cyclohexane, n-hexane, propane, pyrrole, and thiophene.

In a preferred embodiment, the crystalline catalytic substrate mentioned above is made of iron, cobalt, nickel, or an alloy of these metals.

The electrode of this invention is an electrode with graphite as the active material and the catalytic substrate as the current collector unified, and the said graphite is pyrolytic graphite that is deposited on a crystalline metal electrode substrate with catalytic properties by the method mentioned above so as to cover the said crystalline metal electrode substrate.

In a preferred embodiment, the crystalline metal electrode substrate mentioned above is made of iron, cobalt, nickel, or an alloy of these metals.

Thus, the invention disclosed herein makes possible the objects of (1) providing a method for the manufacture of a thin film of pyrolytic graphite with high crystallinity, which can be used as functional materials and functional elements by the use of anisotropy thereof; (2) providing a method for the manufacture of pyrolytic graphite with high crystallinity in which a crystalline metal with catalytic properties is used for the substrate so that graphitization is promoted at relatively low temperatures, resulting in pyrolytic graphite that has high crystallinity; (3) providing an electrode that has a very large electrical capacity because the graphite covering the substrate is highly ordered and adheres very well to the substrate, and compared to the graphite electrodes manufactured by conventional methods, doping and undoping is easily done; (4) providing an electrode that is strong in its charge-discharge cycle and resistant to being overcharged; (5) providing an electrode that has high filling density, since neither further additional conductive material nor binder is required; (6) providing an electrode that active material of which is effectively used because the thin graphite film is formed directly on the substrate so that the internal resistance can be low; (7) providing an electrode that is produced at low cost, because the manufacturing processes are simplified; and (8) providing an electrode that can be shaped into a film form because the vapor deposition method is used, making it possible to cover a substrate of any shape with a graphite.

BRIEF DESCRIPTION OF THE DRAWINGS

This invention may be better understood and its numerous objects and advantages will become apparent to those skilled in the art by reference to the accompanying drawings as follows:

FIG. 1 is a block diagram showing an apparatus for the manufacture of a graphite electrode of this invention.

FIG. 2 is a diagram showing an example of the results of X-ray diffraction of the pyrolytic graphite of the graphite electrode of this invention.

DESCRIPTION OF THE PREFERRED EMBODIMENTS

Example

Figure 3:
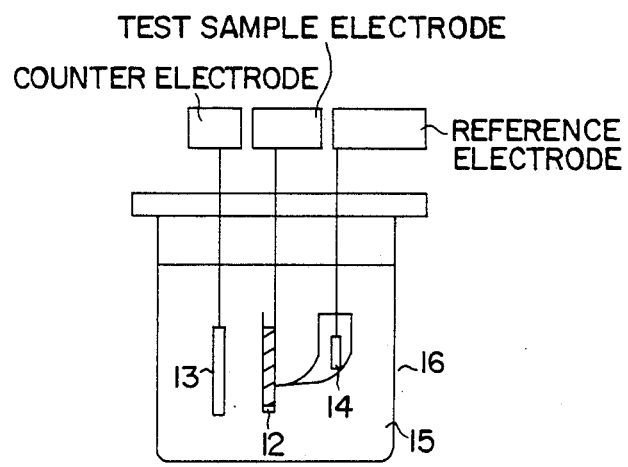
FIG. 3 is a diagram showing an apparatus for the measurement of the electrode characteristics of the graphite electrode of this invention.

FIG. 1 is a block diagram showing the apparatus for the production of the graphite electrode of this invention. As a starting material, hydrocarbons and hydrocarbon compounds one part of which is substituted by a variety of specific groups are used, such as aliphatic hydrocarbons (preferably, unsaturated hydrocarbons), aromatic compounds, and alicyclic compounds. These are thermally-decomposed at about 1000° C. or below. The above-mentioned hydrocarbons and hydrocarbon compounds are, for example, acetylene, diphenylacetylene, acrylonitrile, 1,2-dibromoethylene, 2-butyne, benzene, toluene, pyridine, aniline, phenol, diphenylanthracene, pyrene, hexamethylbenzene, styrene, allylbenzene, cyclohexane, n-hexane, propane, pyrrole, and thiophene.

According to the kind of hydrocarbon compound that is used, the above-mentioned hydrocarbon compound is supplied to the reaction tube by the ordinary-pressure bubbling method, evaporation, or sublimation. Whichever method is used, it is possible to obtain pyrolytic graphite of high orientation and layer order, as will be described below. With the ordinary-pressure bubbling method, hydrogen or argon gas is used as the carrier gas. FIG. 1 shows the structure of the apparatus used with the ordinary-pressure bubbling method. The reduced pressure CVD method can also be used with this apparatus, in which the thickness of the film of graphite obtained is more uniform than that obtained by the ordinary-pressure bubbling method. The amount of the starting material supplied to the reaction tube is adjusted to a few milli moles or less per hours. As an underlying electrode substrate on which the pyrolytic graphite is formed, a crystalline nickel substrate is employed here, as one example.

Below, the steps in manufacturing are explained.

To a container 1, which contains benzene that has been carefully refined by vacuum distillation, argon gas is supplied from an argon gas control system 2 so as to bubble the benzene. Then, benzene molecules are supplied to a quartz reaction tube 4 through a Pyrex glass tube 3. At this time, the liquid benzene in the container 1 is maintained at a fixed temperature, and the flow rate of the argon gas is controlled by valves 5 so that the amount of benzene molecules to be supplied into the reaction tube 4 is controlled at a few milli moles per hour. Elsewhere, argon gas flows through a dilution line 6, and immediately before being supplied to the reaction tube 4, the number density of the benzene molecules in the argon gas in the glass tube 3 and the flow rate are made optimum. In reaction tube 4, there is provided a sample holder 7 on which a crystalline nickel substrate for growth is placed. There is a furnace 8 surrounding the outside of reaction tube 4. This furnace 8 keeps the electrode substrate in reaction tube 4 at about 1000° C. or below. When benzene molecules are supplied to the inside of the reaction tube 4, these benzene molecules are thermally-decomposed within the reaction tube 4 to form pyrolytic graphite, which is then deposited gradually on the substrate for growth. The gas in reaction tube 4 is taken via a gas-ejection pipe 9 into a gas ejection system 10, and thus the gas is removed from the reaction tube 4. The benzene molecules introduced into the reaction tube 4 are thermally-decomposed at a temperature of about 1000° C. or below, and then are grown on the substrate.

According to the above-mentioned manufacturing process, the pyrolytic graphite that is grown has excellent crystallinity because of the catalytic effects of the crystalline nickel used as the substrate, and graphitization can be achieved at low temperatures that do not cause deterioration or melting of the electrode substrate. Also, the film of pyrolytic graphite that is formed covers the nickel substrate firmly. This example of the manufacturing process of this invention causes graphitization to occur at temperatures lower than in the conventional formation methods for graphite materials with high crystallinity, so the desired graphite electrode can be obtained. Moreover, in this manufacturing method, by the selection of the starting material, the amount of the starting material that is supplied, the supply rate, and the reaction temperature, it is possible to control freely the thickness and the degree of crystallinity of the graphite film that is formed on the substrate.

The crystallinity of the pyrolytic graphite that is obtained by the manufacturing method of this invention was evaluated by X-ray diffractometer. FIG. 2 shows the X-ray diffraction for this graphite with the CuK$_\alpha$ rays.

From diffraction angle corresponding to (002) reflection peak, the mean interlayer separation determined by the Bragg equation is 3.36±0.01 Å.

$$d = \frac{\lambda}{2\sin\theta} \text{ (wherein } \lambda = 1.5418 \text{ Å)}$$

From half-width value of the peak, $\beta$, the size of the unit crystal in the c-axis direction determined by the following equation (1) is 350 Å.

$$Lc = \frac{K \cdot \lambda}{\beta \cos\theta} \quad (1)$$

(wherein $\lambda = 1.5418$ Å and $K = 0.9$)

According to the manufacturing method of this invention, at relatively low temperatures of about 1000° C. or less, pyrolytic graphite with an interlayer distance of about the same as that of graphitic crystal (d=3.35 Å) and with high crystal unit, in which c-axis orientation of carbon layer perpendicular to the surface of the substrate is achieved.

Figure 4:
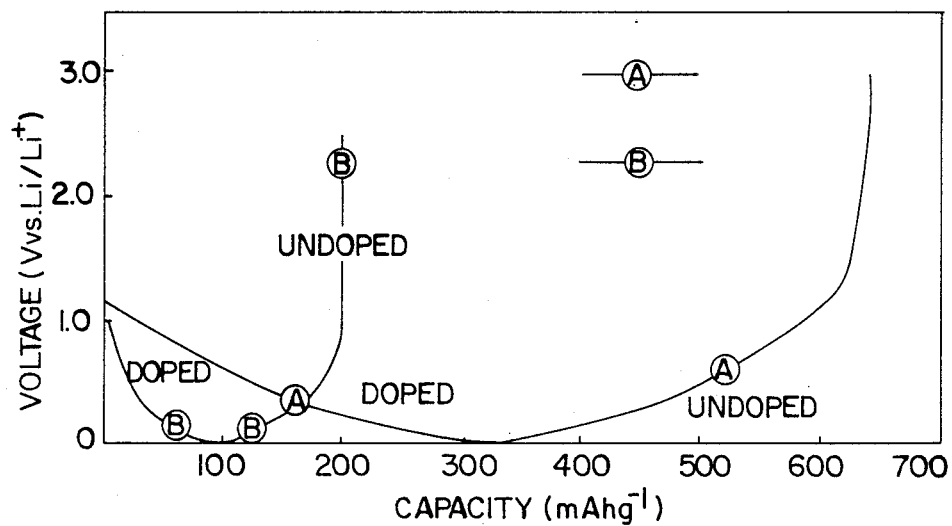
FIG. 4 shows charge-discharge characteristic curves of the graphite electrode of this invention and other graphite material.
Figure 5:
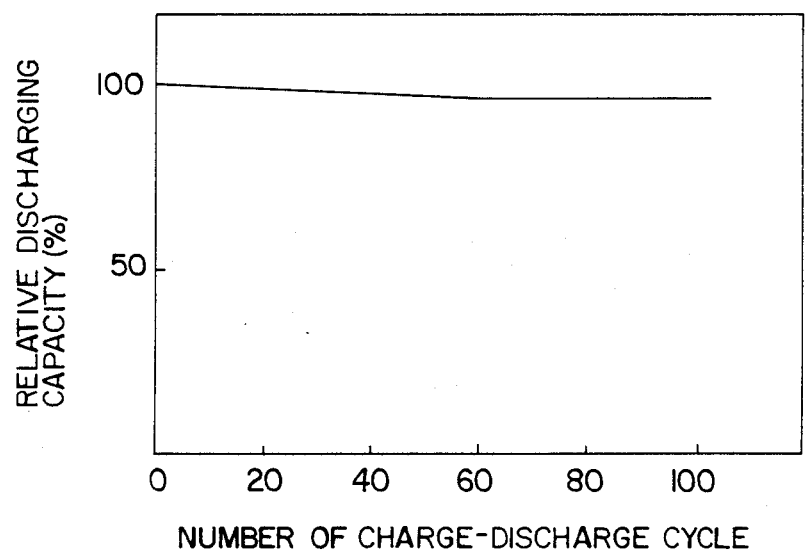
FIG. 5 shows the dependence of discharge-capacities on the charge-discharge cycle number of the graphite electrode of this invention.

A lead wire was connected at a point of a nickel of the graphite electrode made in this way, and this was used as a test sample electrode A. The test sample electrode A is, as shown in FIG. 3, immersed in an electrolytic bath, which is provided with lithium metal as the counter-electrode, and a charging and discharging test, in which atoms of lithium as the dopant are incorporated into and removed from the sample electrode A, is carried out. In FIG. 3, the reference numeral 12 is the test sample electrode A made from the graphite electrode of this example, 13 is the counter-electrode, and 14 is the reference electrode, which is of lithium, 15 is an electrolytic solution of propylene carbonate containing 1M lithium perchlorate, and 16 is the electrolytic bath. FIG. 4 is of curves showing changes in the electric potential of each graphite electrode based on that of the lithium reference electrode at 25° C. when a variety of graphite electrodes are doped or undoped with lithium. The curve A in FIG. 4 shows changes in the electric potential when the graphite electrode of this example is used. In Curve A, the area in which the potential approaches 0 volts indicates doping (i.e., charging), and the area in which the potential approaches high voltages indicates undoping (i.e., discharging). FIG. 5 shows changes in the discharging capacity of the graphite electrode in a charging and discharging test in which the graphite electrode of this example is charged and discharged with a fixed current flow in the range of 0 to 2.5 volts, with respect to the lithium reference electrode. The curve in FIG. 5 is a characteristic curve for this example, which clearly indicates that there is almost no deterioration in the capacity even with repeated charging and discharging, and thus the characteristics on repeated charging and discharging of the electrode are extremely satisfactory.

It is therefore possible to use those mentioned above as an anode for a nonaqueous lithium rechargeable battery.

In this example, 1M lithium perchlorate was used as an electrolyte and propylene carbonate was used as a solvent for the electrolyte. However, not only the electrolyte specified in this example, but also other electrolytes can be used alone or in a mixture, such as lithium perchlorate, lithium hexafluoroarsenate, lithium borofluoride, lithium trifluoromethanesulfonate, etc. Dimethylsulfoxide, $\gamma$-butyrolactone, sulfolane, tetrahydrofuran, 2-methyltetrahydrofuran, 1,2-dimethoxyethane, 1,3-dioxolane, and other organic solvents, and water can be used as a single solvent or as a mixed solvent.

The pyrolytic graphite with high crystallinity of the graphite electrode obtained by the manufacturing method shown in this example of this invention has interlayer spacing in the range of 3.35 to 3.55 Å depending on the supply rate of the starting material and the reaction temperature. Any of the graphite electrodes made from any of the pyrolytic graphites with high crystallinity mentioned above have a large electrical capacity and satisfactory characteristics on charge-discharge repeat.

The manufacture of the graphite electrode that has the electrode characteristics mentioned above is not limited to the manufacturing method of this example, but such an electrode can also be manufactured by the optimized CVD method, etc., with the use of resistance heating or high-frequency conductive heating.

Control

Commercially available graphite fibers were held by a current collecting net, resulting in a test sample electrode B. The test sample electrode B was placed within the electrolytic bath as shown in FIG. 3, in which a charge-discharge test was carried out in the same way as in the above-mentioned example. Curve B of FIG. 4 is the curve of changes in the electric potential of the carbon electrode obtained by the support by the current collecting net. The results show that compared to the electrode of the above-mentioned example, the electrode of this control example has a small discharging capacity and is not suitable for use as an electrode.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the manufacture of a pyrolytic graphite comprising the deposition of graphite directly onto a crystalline catalytic substrate by thermal decomposition of a carbon-containing material at a temperature of 1000° C. or less, said pyrolytic graphite having interlayer spacing in the range of 3.35 to 3.55 Å and a c-axis orientation of carbon layers perpendicular to the surface of said substrate.

2. A method according to claim 1, wherein said carbon-containing material is at least one compound selected from the group consisting of acetylene, diphenylacetylene, acrylonitrile, 1,2-dibromo-ethylene, 2-butyne, benzene, toluene, pyridine, aniline, phenol, diphenyl, anthracene, pyrene, hexamethylbenzene, styrene, allylbenzene, cyclohexane, n-hexane, propane, pyrrole, and thiophene.

3. A method according to claim 1, wherein said crystalline catalytic substrate is made of iron, cobalt, nickel, or an alloy of these metals.

4. An electrode with graphite as an active material and a crystalline metal electrode substrate as a current collector unified, said graphite being pyrolytic graphite that is deposited on said crystalline metal electrode substrate with catalytic properties so as to cover said crystalline metal electrode substrate by the method according to claim 1.

5. An electrode according to claim 4, wherein said crystalline metal electrode substrate is made of iron, cobalt, nickel, or an alloy of these metals.

* * * * *